United States Patent

Suzuki

[19]

[11] Patent Number: 5,861,059
[45] Date of Patent: Jan. 19, 1999

[54] METHOD FOR SELECTIVE GROWTH OF SILICON EPITAXIAL FILM

[75] Inventor: Tatsuya Suzuki, Tokyo, Japan

[73] Assignee: NEC Corporation, Tokyo, Japan

[21] Appl. No.: 694,936

[22] Filed: Aug. 9, 1996

[30] Foreign Application Priority Data

Aug. 23, 1995 [JP] Japan .................................. 7-214738

[51] Int. Cl.⁶ ................................................... C30B 25/02
[52] U.S. Cl. ................................................... 117/97; 47/95
[58] Field of Search .................................. 117/930, 935, 117/913, 95

[56] References Cited

U.S. PATENT DOCUMENTS 4,361,461 11/1982 Chang ..................................... 156/643

FOREIGN PATENT DOCUMENTS 01-313395 12/1989 Japan .
474415 3/1992 Japan .

OTHER PUBLICATIONS

"Facet formation of silicon selective epitaxial layer by Si ultrahigh vacuum chemical vapor deposition". T. Aoyama et al., Journal of Crystal Growth 136(1994) pp. 349–354.

*Primary Examiner*—Felisa Garrett
*Attorney, Agent, or Firm*—Sughrue, Mion, Zinn, Macpeak & Seas, PLLC

[57] ABSTRACT

Atomic hydrogen is mixed with a raw material gas such as disilane in the selective growth of epitaxial silicon using insulating film masks, so as to control facet formation at the end portion of the selectively grown film where the silicon film comes in contact with the insulating film sidewall. Adsorption of atomic hydrogen leads to hydrogen termination of the silicon surface which remarkably reduces the surface free energy, thereby eliminating anisotropy of surface free energy and forming a facet-free selective silicon epitaxial film. A selective epitaxial film sufficiently thick for shallow junction source/drain regions of MOSFETs can be formed under the selective silicon epitaxial growth condition, i.e., high substrate temperature (700° C. or higher) and low disilane flow rate, with the flow rate of hydrogen set to 4 sccm or more, and at least 5% of said hydrogen gas being dissociated into atomic hydrogen.

27 Claims, 7 Drawing Sheets

METHOD FOR SELECTIVE GROWTH OF SILICON EPITAXIAL FILM

BACKGROUND OF THE INVENTION

1. Field of the Invention

The present invention relates to a method for selective growth of silicon epitaxial films utilizing insulating film masks and silane ($SiH_4$) or silane-based gases such as disilane ($Si_2H_6$), diborane ($B_2H_6$), germane ($GeH_4$) or the like as raw material gases and particularly to a method for controlling a shape of an end portion of the selectively grown silicon epitaxial film in contact with a sidewall of an insulating film mask.

2. Description of the Related Art

First, an apparatus used in the growth method of this kind will be outlined.

FIG. 9 shows an example of an apparatus used for selective growth of silicon epitaxial films on a silicon substrate utilizing silane or silane-based gases such as disilane or the like as a raw material.

A selective silicon epitaxial growth apparatus of this kind is provided, in general, with a vacuum chamber consisting of a growth chamber 2 and a heater chamber 3 equipped with a substrate heater 4, a susceptor 5 for supporting a silicon substrate 1 and a turbo molecular pump 6 for differential pumping of the growth chamber 2 and the heater chamber 3. As shown in FIG. 9, the growth chamber 2 and the heater chamber 3 are separated by means of a silicon substrate 1 on which the selective growth is to be performed. Silane-based raw material gases, for example, silane, disilane, or diborane or germane are introduced into the growth chamber 2 from a gas nozzle 9 provided at the upper portion of the growth chamber 2. In this apparatus, only the silicon substrate 1 is heated by the substrate heater 4, so that the stainless steel growth chamber 2 is not heated. Therefore, the raw material gases introduced from the gas nozzle 9 are not decomposed in the vapor phase but are thermally dissociated and adsorbed on silicon atoms of the silicon substrate 1. There, they release extra hydrogen atoms to deposit silicon epitaxially.

On the other hand, since the raw material gas directly reaches the surface of the silicon substrate 1 without producing chemically active intermediate products in the vapor phase, the raw material gas molecules are not easily adsorbed on masks made of insulating films such as silicon oxide or silicon nitride. In the alternative, it is difficult for silicon to grow, because even if the raw material is adsorbed on the silicon surface, it is immediately desorbed. Consequently, silicon grows selectively on the silicon substrate during a latent period until formation of silicon is initiated on the mask film and such latent period or "dead time" is determined by the substrate temperature and a flow rate of the raw material gas.

In such selective epitaxial growth processes of silicon, under certain growth conditions, "facetting" or formation of crystalline facets occur near the end portions of the selectively grown film where they are in contact with the sidewalls of the insulating film masks. Due to this facetting, the thickness of the selectively grown silicon film is decreased at such end portions of the epitaxial films. As described in the Journal of Crystal Growth 136 (1994) pp. 349–354, facets have different surface free energies depending on the surface orientation of the silicon crystal, and therefore not only the (100) surface, but also (111) or (311) surfaces having a small surface free energy are also formed at the initial stage of silicon growth on, for example, the (100) silicon substrate. Facetting occurs as a result of the epitaxial growth progressing with this shape or condition intact. The reason why a surface having a small surface free energy is formed as described above is considered to be that increase of free energy due to the precipitation of crystal silicon is minimized by formation of such facets.

As described, for example, in the official gazette of the Japanese Patent Laid-Open No. Hei 4-74415(1992), facet formation is suppressed at the end portion of the selectively grown silicon epitaxial film, i.e., the area in contact with the insulating film mask sidewall, if the growth condition is such that the substrate temperature is set low and the flow rate of raw material gas is set high. When the substrate temperature is set low and flow rate of raw material gas, for example, of disilane is set at a high value, facetting becomes difficult for the following reasons. At lower substrate temperatures, hydrogen atoms dissociated from disilane are adsorbed more easily on the silicon surfaces. The amount of adsorption also increases when the flow rate of disilane is higher. When hydrogen terminates the silicon atoms on the surface, the surface free energy at the silicon surface terminated by adsorbed hydrogen atoms is remarkably lowered and the resulting dependence of surface free energy on the surface orientation can be eliminated, thereby suppressing facetting.

On the contrary, when the substrate temperature is set high and the flow rate of raw material gas, for example, disilane is set low, facetting is enhanced because hydrogen adsorption is suppressed and the effect of reducing dependence of surface free energy on surface orientation due to hydrogen termination becomes smaller.

An important application of the selective epitaxial silicon film is formation of a shallow junction structure at the source/drain portion of a very small MOS transistor of the 0.1 $\mu$m rule level. In this kind of MOS transistor, after device area isolation oxide films and gate electrodes are formed on the silicon substrate, epitaxial silicon films are selectively grown on the portions of silicon which will become source/drain regions in order to form a source/drain structure having a shallow PN junction. This is done to suppress the so called "short channel effect". Thereafter, ion implantation is performed to form the source/drain region in a conventional manner. However, if a facet is formed at the end portions of the epitaxial film, as explained previously, depth of the implanted PN junction increases at portions close to the sidewall area where the facet is formed because there, the epitaxial film is thinner. As a result, the desired effect of suppressing the short channel effect is deteriorated.

Because of the reason explained above, it has been long desired to provide a method for selective epitaxial growth of silicon by which the facet is never formed at the sidewall portion. In the official gazette of the Japanese Patent Laid-Open No. Hei 4-74415(1992) explained above, a conventional method for selective epitaxial growth of silicon that focuses on the fact that formation of the facet depends on difference of the growth condition is disclosed. There, the growth condition that the substrate temperature is set low and flow rate of the raw material gas is set high is introduced as the method for growth of selective epitaxial film by which a facet is never formed.

The above conventional method for selective epitaxial growth of silicon has certain drawbacks which will be explained hereafter with reference to FIG. 6. FIG. 6 shows, for 4 different growth temperatures, maximum attainable selective epitaxial film thicknesses as a function of disilane flow rate, wherein selective growth is performed in an opening formed on an oxide film mask using disilane as a raw material gas. It is obvious from FIG. 6 that the thickness of a silicon epitaxial film which may be selectively grown under the conditions for suppressing facetting, i.e., low substrate temperature and high flow rate of raw material gas, becomes very small. This poses a problem when application of the selective epitaxial silicon film to the shallow junction source/drain region of the MOS transistor explained above is attempted, because a thickness of about 1000 Å is required for the epitaxial film. Therefore, in order to selectively form a silicon epitaxial film of about 1000 Å, growth must be performed under the growth condition of substrate temperatures higher than 650° C. and flow rate of disilane lower than 4 sccm. This growth condition inevitably includes a problem that facets are formed at the end portions of the selective silicon epitaxial film as described previously.

SUMMARY OF THE INVENTION

It is therefore an object of the present invention to provide a method for selective epitaxial growth of a silicon film which can grow a thickness of about 1000 Å without formation of facets at the end portions of the selective silicon epitaxial film in the vicinity of the sidewalls of the insulation film masks.

The method for growth of the selective silicon epitaxial film of the present invention is characterized in that a shape of the selective silicon epitaxial film at the end portions can be controlled by introducing atomic hydrogen together with the raw material gas under the substrate temperature and flow rate condition capable of obtaining sufficiently thick selective film growth. Namely, the substrate temperature is set high and flow rate of the raw material gas for the growth of the selective silicon epitaxial film, silane or silan-based gases such as disilane, diborane, germane or the like is set low.

Atomic hydrogen is adsorbed on the silicon surface to largely reduce the surface free energy of silicon, bringing about the effect of reducing non-uniformity of the surface free energy due to dependence on the crystal orientation of the silicon surface. Formation of facets at the end portions of the selective silicon epitaxial film (portion in contact with sidewalls of the insulating film) can be controlled by allowing atomic hydrogen to flow together with the raw material gas.

Such atomic hydrogen may be produced by decomposing hydrogen gas using a tungsten filament heated up to a high temperature. It is also possible to dissociate hydrogen molecules by bombardment of hot electrons which may be produced by disposing an electrode on the side of the hot filament and giving the electrode a positive potential relative to the filament.

BRIEF DESCRIPTION OF THE DRAWINGS

The above and other objects, advantages and features of the present invention will be more apparent from the following description taken in conjunction with the accompanying drawing in which.

DESCRIPTION OF THE PREFERRED EMBODIMENTS

The present invention will be explained hereinafter with reference to the accompanying drawings.

Figure 1:
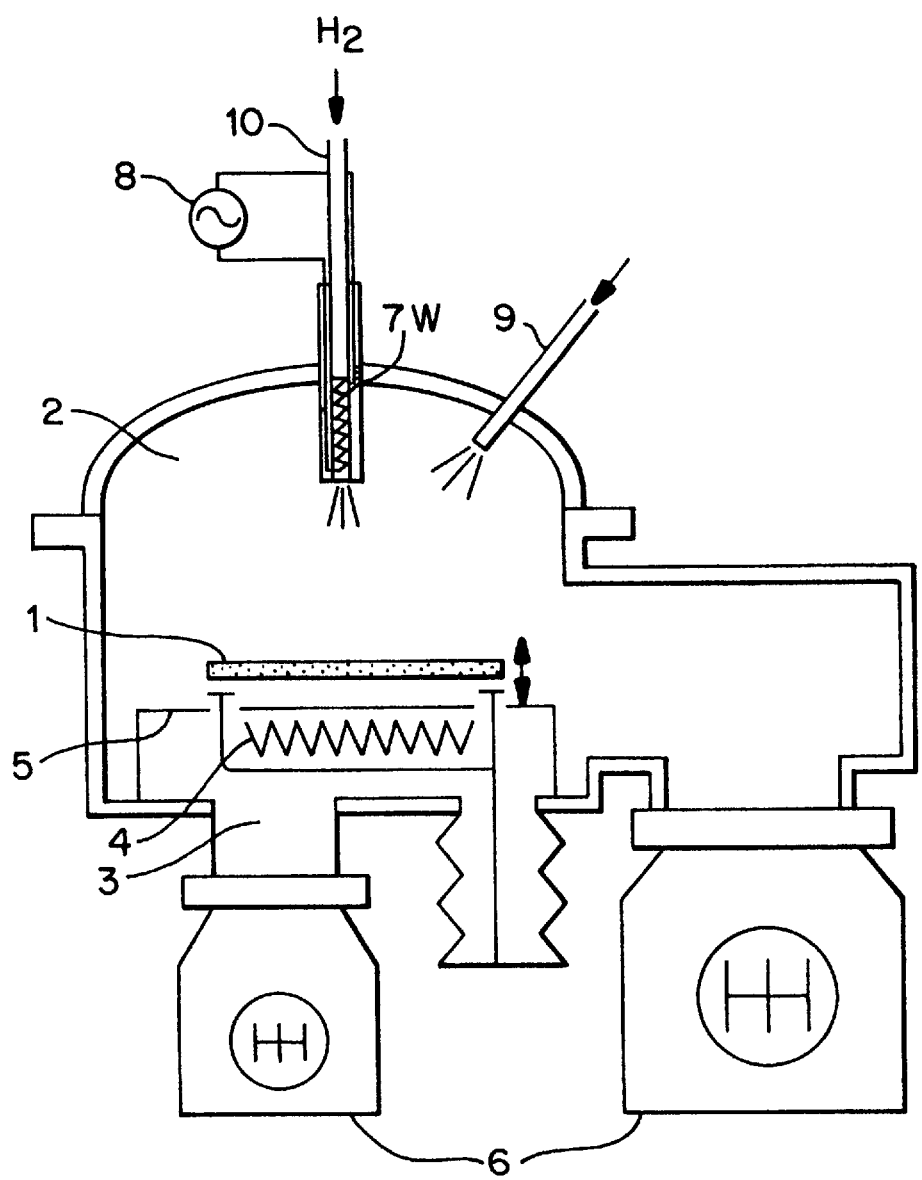
FIG. 1 shows a growth apparatus which is used in an embodiment of the present invention.
Figure 9:
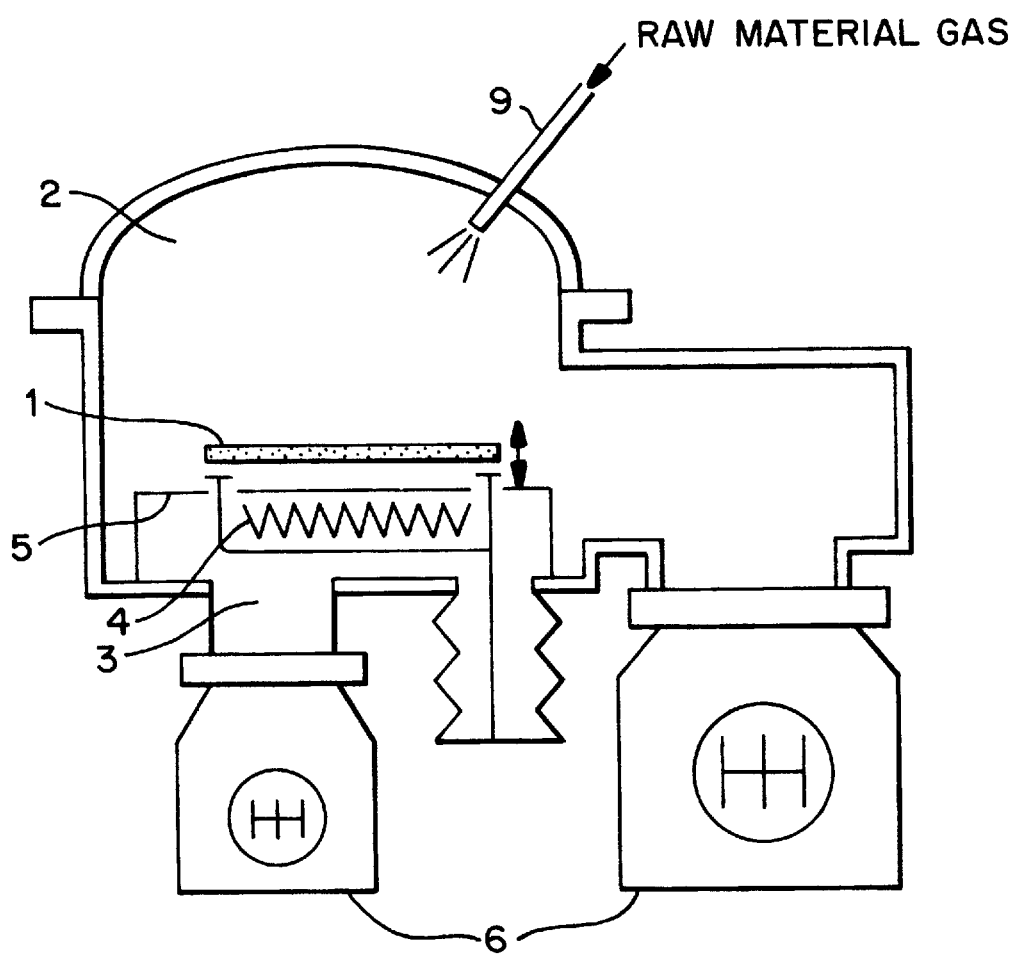
FIG. 9 Prior Art is a schematic diagram of the selective silicon epitaxial growth apparatus of the related art.

FIG. 1 shows a selective silicon epitaxial growth apparatus used in the first embodiment of the present invention. In the apparatus shown in the figure, the structural elements similar to those in the selective silicon epitaxial growth apparatus shown in FIG. 9 (Prior Art) are designated by the same reference numerals. That is, the selective silicon epitaxial growth apparatus shown in FIG. 1 comprises, a growth chamber 2, a heater chamber 3 equipped with a substrate heater 4, a susceptor 5 for supporting a silicon substrate 1 and a turbo molecular pump 6 for differentially pumping the growth chamber 2 and heater chamber 3. In addition, it further comprises an atomic hydrogen generator comprising a gas inlet pipe 10 for introducing hydrogen gas into the growth chamber 2, a W-filament 7 for dissociating molecular hydrogen into atomic hydrogen, and a power supply 8 for heating the W-filament 7 by passing electric current therethorough. The power supply 8 could be an ac power supply or a dc power supply. Partial pressure of hydrogen was measured using a Pirani gauge located close to the W-filament.

The W-filament 7 consisted of ten 40 mm long—1.0 mm-diameter tungsten wires. The distance between the W-filament 7 and the substrate was set to approximately 50 cm, well smaller than the mean free path for the pressure during growth. About 5% of the hydrogen gas is dissociated into atomic hydrogen when it passes near the W-filament heated up to a temperature in the excess of about 1200° C. Even under a growth condition of high substrate temperature and low raw material gas flow rate, a high coverage ratio of hydrogen on the silicon surface can be realized by introduction of atomic hydrogen. Thus, surface free energy's dependence on crystal surface orientation is lowered and accordingly facetting at the end portion of epitaxial film can be controlled.

An example of a selective silicon epitaxial growth on a silicon substrate having an oxide film mask with partial openings using disilane as the raw material gas will be explained hereunder.

First, a 150 mm diameter silicon substrate having a (100) surface was wet-oxidized at 1000° C. to form a thermal oxide film of 2000 Å on the surface. Next, an opening was formed on this substrate by a conventional photolithography and wet etching with buffered hydrofluoric acid of about 17 vol. %. The areal percentage of the opening on the oxide film was set to 10% of the total substrate area. Subsequently, in order to remove organics and particles from the surface, the substrate was cleaned for 10 minutes at 70° C. with chemicals consisting of a mixture of ammonia, hydrogen-peroxide, and deionized (DI) water (composition ratio; 1:5:20). Thereafter, the substrate was rinsed in DI water for 10 minutes. The substrate is then soaked into a 0.5 vol. % diluted hydrofluoric acid to remove native oxide films formed on the substrate surface and is then washed in DI water for two (2) minutes. Finally, the substrate was dried up using a spin dryer. This substrate was set into the growth chamber 2 which was brought under vacuum of $1 \times 10^{-9}$ torr in the growth apparatus shown in FIG. 1.

The substrate 1 was heated up to 700° C. and kept at that temperature by the substrate heater 4. Thereafter, disilane gas was introduced into the growth chamber 2 at a flow rate of 1 sccm. Hydrogen gas was introduced simultaneously, at a flow rate of 0 to 5 sccm, into the growth chamber 2 through the inlet 10. The W-filament 7 was heated up to 2000° C. Under this condition, a 1000 Å thick epitaxial silicon film was grown selectively in about 5 min. In this process, the partial pressure of disilane gas was fixed at $2.5 \times 10^{-5}$ torr. Meanwhile, the partial pressure of hydrogen gas was controlled in the range of $\sim 1 \times 10^{-9}$ to $1.2 \times 10^{-4}$ torr, which corresponded to the hydrogen gas flow rate of 0 to 5 sccm.

Figure 2:
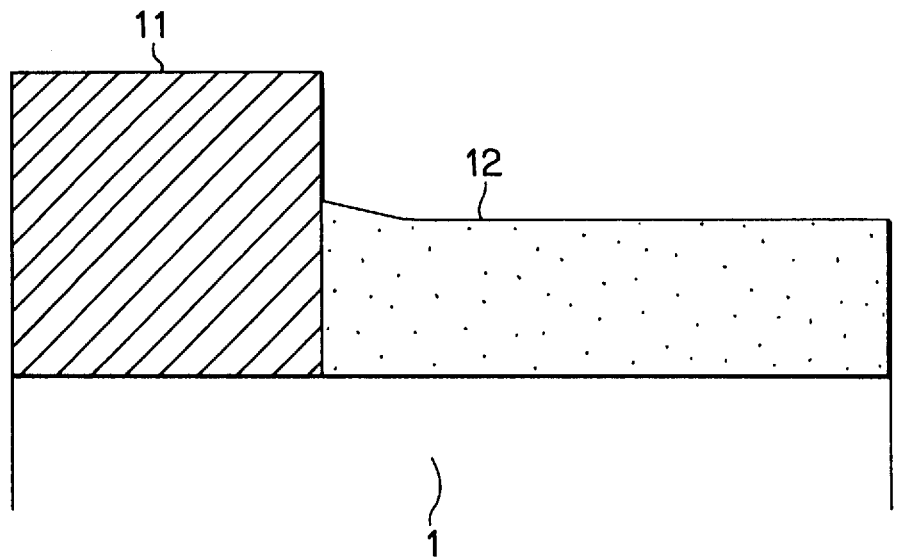
FIG. 2 is a schematic diagram of a silicon epitaxial film selectively grown in the apparatus of FIG. 1 under the condition that the flow rate of hydrogen gas is set to 5 sccm.
Figure 3:
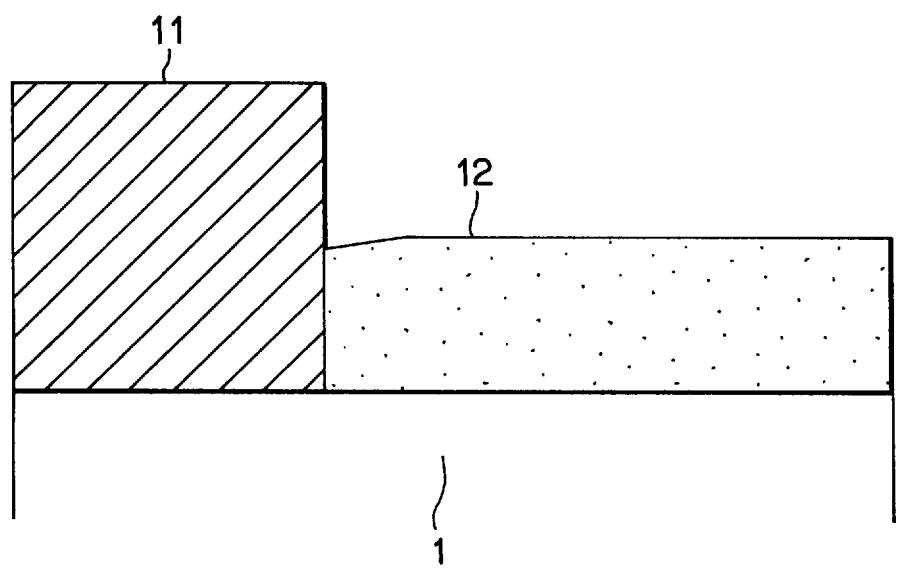
FIG. 3 is a schematic diagram of a silicon epitaxial film selectively grown under the condition that the flow rate of hydrogen gas is set to 4 sccm.
Figure 4:
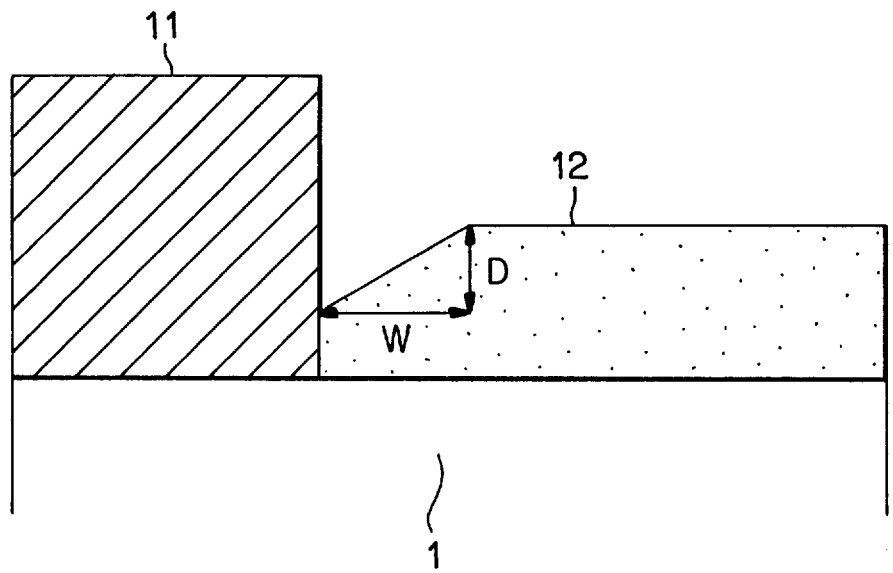
FIG. 4 is a schematic diagram of a silicon epitaxial film selectively grown under the condition that the flow rate of hydrogen gas is set to 1 sccm.
Figure 5:
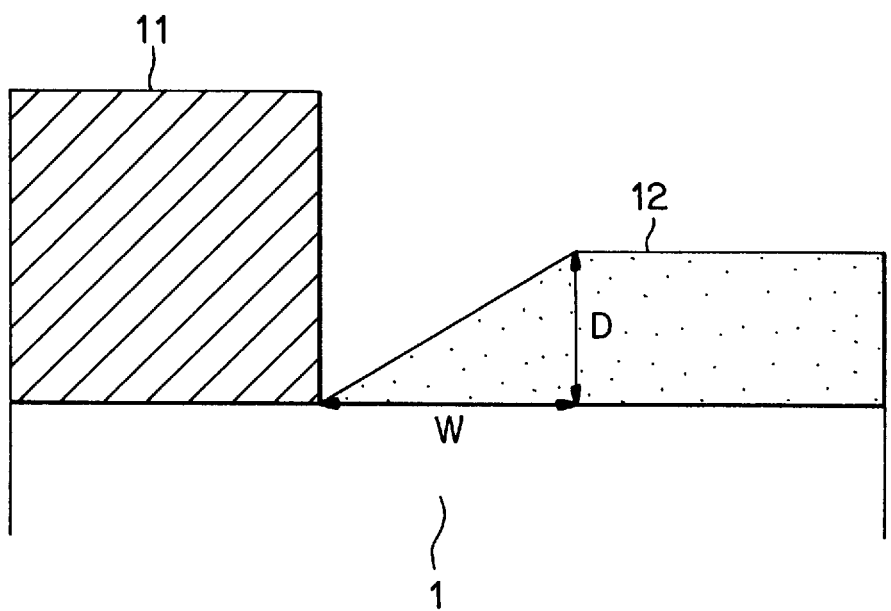
FIG. 5 is a schematic diagram of a silicon epitaxial film selectively grown by the method of the related art for growth of the selective silicon epitaxial film.
Figure 6:
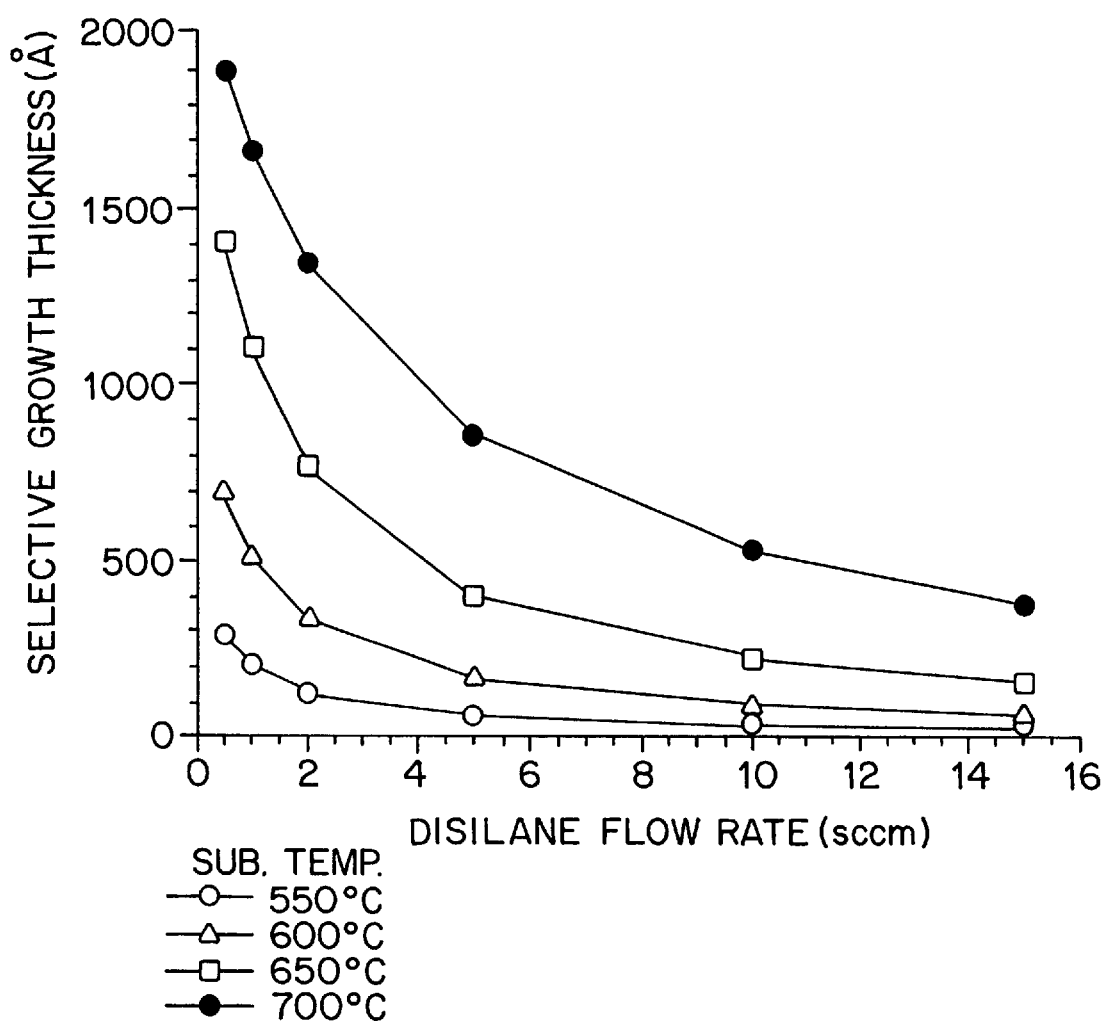
FIG. 6 shows dependence of maximum attainable selective epitaxial film thicknesses on disilane flow rate, obtained by the selective growth method of the related art.

FIG. 2 to FIG. 5 show schematic diagrams of cross-sectional views of selectively grown silicon epitaxial films under the hydrogen gas flow rates of: 5, 4, 1 and 0 sccm. The corresponding partial pressure of hydrogen is $1.2 \times 10^{-4}$, $9.6 \times 10^{-5}$, $2.4 \times 10^{-5}$ and $\sim 1 \times 10^{-9}$ torr, respectively. As shown in FIG. 5, it is obvious that when no hydrogen gas is introduced, a large facet is formed at the end portion of the silicon epitaxial film 12 where it is in contact with the masking silicon oxide film 11. Defining the width of the facet portion as W and its height as D, W was 2000 Å, while D was 1000 Å. As shown in FIG. 4, when the flow rate of hydrogen gas was set to be 1 sccm, the facet area was reduced to the extent that W was 1000 Å and D was 500 Å. Moreover, when the flow rate of hydrogen gas was set to 4 and 5 sccm, as shown in FIG. 3 and FIG. 2, respectively, facetting was remarkably controlled to the extent that W was 200 Å and D was 100 Å in both cases.

Figure 8:
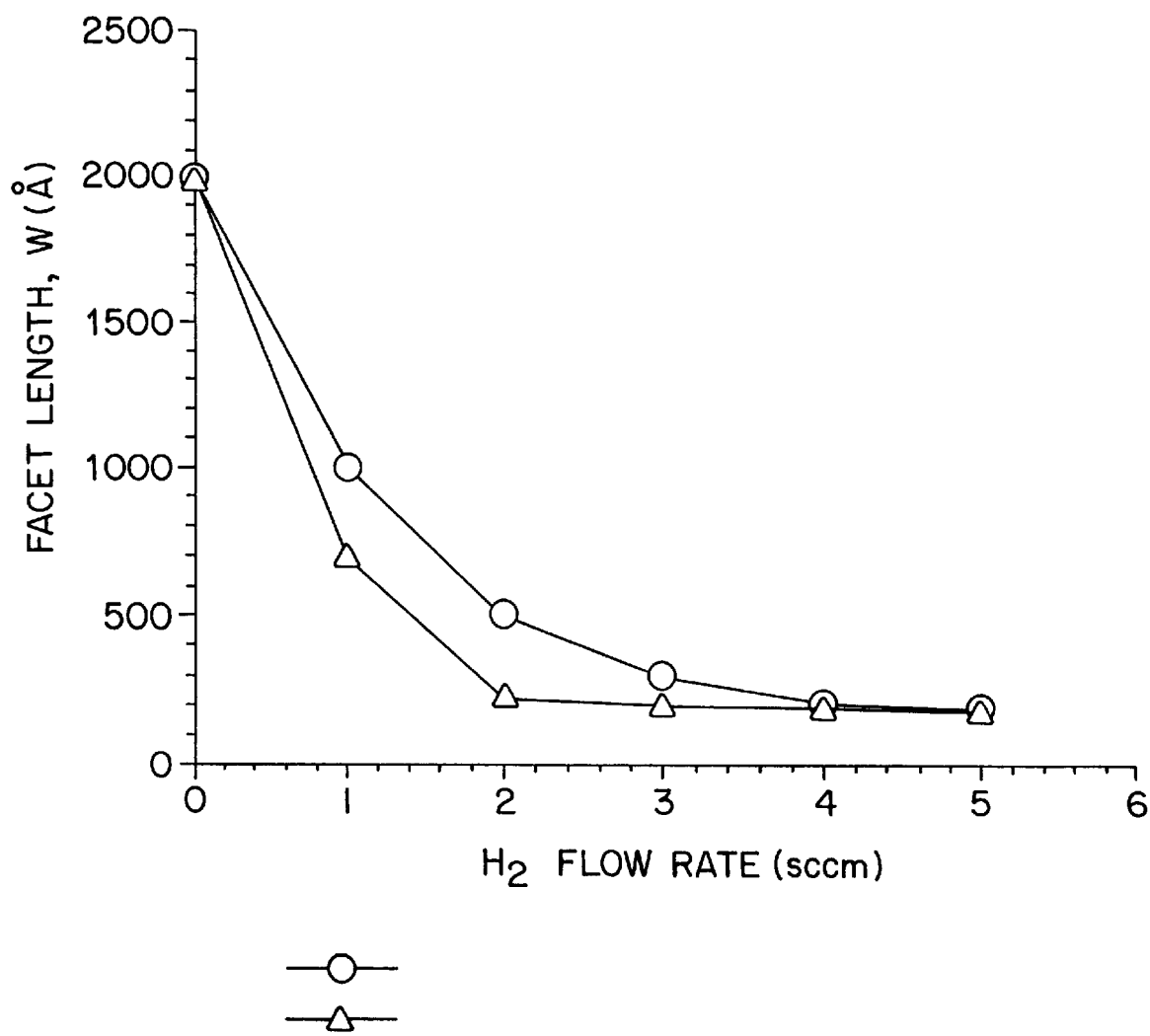
FIG. 8 shows dependence of facet length W on hydrogen gas flow rate, obtained by the selective silicon epitaxial film growth method of the present invention.

FIG. 8 shows dependence of facet length W on hydrogen gas flow rate, obtained by the embodiment described above. As is obvious from FIG. 8, increase in the flow rate of hydrogen gas is effective for distinctive control over facet formation. It is because, more hydrogen gas molecules dissociate into atomic hydrogen when it passes through gass inlet pipe 10 touching the W-filament 7 heated up to a high temperature by using the filament power supply 8. Thus, surface free energy can be more effectively controlled, hence facet formation may be more effectively controlled.

Next, the second embodiment of the present invention will be explained.

Figure 7:
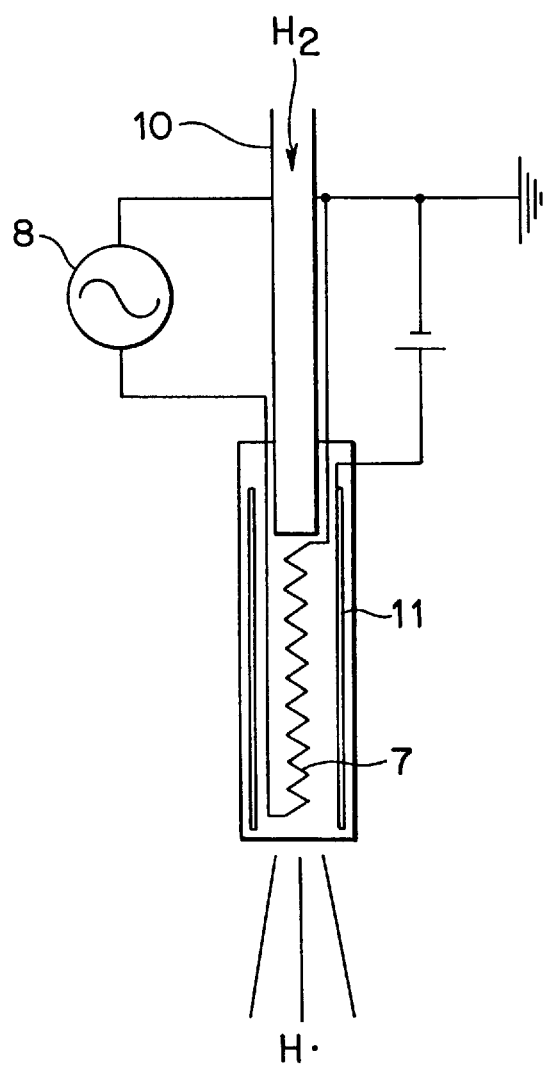
FIG. 7 is a schematic diagram of an atomic hydrogen generator used for an embodiment of the present invention.

FIG. 7 is a schematic diagram of an atomic hydrogen generator to be used in the second embodiment of the present invention. The structure of the apparatus used in this embodiment is similar to that of the apparatus shown in FIG. 1 except for the atomic hydrogen generator. With reference to FIG. 7, the atomic hydrogen generator is provided with an electron extraction electrode 11 to lead out the hot electrons generated by the W-filament 7 heated up to a high temperature by the filament power supply 8. A dc voltage is applied so that the W-filament 7 becomes negative, while the electron extraction electrode 11 becomes positive. An example of the actual growth of the selective silicon epitaxial film is explained hereunder.

The preparation of the silicon substrate was performed in the same manner as the first embodiment. The substrate was set into a growth apparatus having the atomic hydrogen generator shown in FIG. 7. The substrate 1 is heated up to 700° C. with the substrate heater 4 as in the case of the first embodiment. Thereafter, selective silicon epitaxial film of 1000 Å thickness was grown with disilane gas at a flow rate of 1 sccm and hydrogen gas simultaneously introduced at a flow rate of 0 to 5 sccm. The W-filament 7 was heated to 2000° C., while it was electrically grounded and a voltage of 1.5 kV was applied to the electron extraction electrode 11. In this process, a partial pressure of disilane gas was $2.5 \times 10^{-5}$ torr, while that of hydrogen gas was $\sim 1 \times 10^{-9}$ to $1.2 \times 10^{-4}$ torr.

FIG. 8 shows dependence of facet length W on hydrogen gas flow rate, obtained by the second embodiment explained above. As is easily understood from FIG. 8, in the second embodiment, the facet length W was reduced to as small as 200 Å with a hydrogen gas flow rate of 2 sccm or more (partial pressure of $4.8 \times 10^{-5}$ torr), which is lower than that in the first embodiment. This is because hydrogen gas is decomposed into atomic hydrogen not only by touching the tungsten filament but also by collision with the accelerated hot electrons. Since the atomic hydrogen generator of FIG. 7 generates atomic hydrogen with high efficiency, the amount of atomic hydrogen can be increased up to about two times in comparison with that in the first embodiment, that is, the case where hydrogen is decomposed only by the tungsten (W)-filament.

In the above embodiments, atomic hydrogen was generated using a heated tungsten filament. However, atomic hydrogen could also be obtained by exciting hydrogen plasmas in various known ways. For example, hydrogen plasma can be excited within the growth chamber by use of the well known electron cyclotron resonance (ECR) excitation. Glow discharge or other known means may also be utilized.

In the above embodiments, an example of application of the selective silicon epitaxial film into shallow junction source/drain structure of a MOS transistor is disclosed. However, the present invention can naturally be applied to the case where the selective silicon epitaxial film is applied to the channel portion of the MOS transistorand other semiconductor devices as well.

Also, in the above embodiments, epitaxial silicon was grown using disilane as the raw material gas. However, the epitaxial film could be grown using silane (monosilane, $SiH_4$) also. The raw material could include diborane to grow boron doped silicon. It could also include germane to grow silicon-germanium alloy semiconductor films as well. Futher, although the insulating film mask used in the above embodiments were silicon oxide, silicon nitride films or a laminated insulating film comprising plurality of insulating materials such as silicon oxide, silicon-oxynitride, and silicon nitride or the like may also be used.

While the present invention was described in connection with certain preferred embodiments, it is to be understood that the subject matter encompassed by way of the present invention is not to be limited to those specific embodiments. On the contrary it is intended for the subject mattter of the invention to include all alternatives, modifications and equivalents as can be included within the spirit and scope of the following claims.

What is claimed is:

1. A method for selective growth of epitaxial silicon on a silicon substrate partially covered with an insulating film mask characterized in that hydrogen is introduced on said silicon substrate together with a raw material gas including silicon under condition to substantially eliminated facet at and portions of said epitaxial silicon.

2. The method for selective growth of epitaxial silicon as set forth in claim 1, wherein said raw material gas includes at least one of monosilane and disilane.

3. The method as set forth in claim 2, further including the step of forming said epitaxial silicon to a thickness of at least 1000 Å.

4. The method for selective growth of epitaxial silicon as set forth in claim 1, wherein said raw material gas includes disilane and at least one of diborane and germane.

5. The method for selective growth of epitaxial silicon as set forth in claim 1, wherein said raw material gas includes disilane and at least one of diborane and germane, and said insulating film mask is either one of silicon oxide, silicon nitride, and a combination of silicon oxide and silicon nitride.

6. A method for selective growth of epitaxial silicon on a silicon substrate partially covered with an insulating film mask comprising the steps of:
heating said silicon substrate in a growth chamber to a temperature of 700° C. or higher;
flowing a raw material gas containing silicon onto said silicon substrate; and
flowing hydrogen gas onto said silicon substrate at a flow rate corresponding to a hydrogen partial pressure of $9.6 \times 10^{-5}$ Torr or more in said growth chamber to substantially eliminate facets at end portions of said epitaxial silicon.

7. The method for selective growth of epitaxial silicon as set forth in claim 6, wherein said atomic hydrogen is produced by flowing hydrogen gas at a tungsten filament heated up to a temperature sufficient to dissociate hydrogen molecules.

8. The method for selective growth of epitaxial silicon as set forth in claim 6, wherein said atomic hydrogen is produced by flowing hydrogen gas at a tungsten filament heated to 2000° C.

9. The method for selective growth of epitaxial silicon as set forth in claim 6, wherein said insulating film mask is either one of silicon oxide, silicon nitride, and a combination of silicon oxide and silicon nitride.

10. The method as set forth in claim 6, further including the step of forming said epitaxial silicon to a thickness of at least 1000 Å.

11. A method of selective growth of epitaxial silicon on a silicon substrate partially covered with an insulating film mask comprising the steps of:
heating said silicon substrate in a growth chamber to a temperature of 700° C. or higher;
flowing a raw material gas containing silicon onto said silicon substrate; and
flowing atomic hydrogen onto said silicon substrate at a flow rate corresponding to a hydrogen partial pressure of $4.8 \times 10^{-5}$ Torr or more in said growth chamber to substantially eliminate facets at end portions of said epitaxial silicon, wherein said atomic hydrogen is produced by flowing hydrogen gas at a tungsten filament heated up to a temperature sufficient to dissociate at least 5% if hydrogen molecules.

12. The method for selective growth of epitaxial silicon as set forth in claim 11, wherein said atomic hydrogen is produced by flowing hydrogen gas at a tungsten filament heated up to a temperature sufficient to dissociate hydrogen molecules and by applying a voltage difference across said tungsten filament and an electrode arranged near said filament so that said electrode has a potential positive relative to said filament, thereby extracting hot electrons from said filament.

13. The method for selective growth of epitaxial silicon as set forth in claim 11, wherein said atomic hydrogen is produced by flowing hydrogen gas at a tungsten filament to 2000° C. to dissociate hydrogen molecules and by applying a voltage difference of 1.5 kV across said tungsten filament and an electrode arranged near said filament so that said electrode has a potential positive relative to said filament, thereby extracting hot electrons from said filament.

14. The method for selective growth of epitaxial silicon as set forth in claim 11, wherein said insulting film mask is either one of silicon oxide, silicon nitride, and a combination of silicon oxide and silicon nitride.

15. A method of selectively growing an epitaxial semiconductor film on a semiconductor substrate partially covered with an insulting film mask characterized in that hydrogen is introduced on said semiconductor substrate together with a raw material gas including said epitaxial semiconductor film material under condition to substantially eliminate facets at end portions of said epitaxial silicon.

16. The method for selective growth of epitaxial semiconductor film as set forth in claim 15, wherein said raw material gas includes at least one of silane and disilane.

17. A method of selectively growing an epitaxial semiconductor film as set forth in claim 16, wherein atomic hydrogen from said introduced hydrogen is adsorbed on the surface of said silicon substrate to reduce the surface free energy silicon of said silicon substrate.

18. The method for selective growth of epitaxial semiconductor film as set forth in claim 17, wherein said atomic hydrogen reduces non-uniformity of the surface free energy due to dependence of the crystal orientation of said silicon substrate.

19. The method as set forth in claim 18, further including the step of forming said epitaxial silicon to a thickness of at least 1000 Å.

20. A method for selective growth of epitaxial silicon, comprising the steps of:
providing a semiconductor substrate; and
introducing a raw material gas which contains silicon and hydrogen onto said silicon substrate to form an epitaxial silicon film on said semiconductor substrate under condition to substantially eliminate facets at an end portion of said epitaxial silicon.

21. The method as claimed in claim 20, wherein said semiconductor substrate is cleaned with chemicals consisting a mixture of ammonia, hydrogen-peroxide, and deionized water.

22. The method as claimed in claim 21, wherein said semiconductor substrate is soaked in a diluted hydrofluoric acid and then washed in said deionized water after said semiconductor substrate is cleaned.

23. The method as claimed in claim 20, wherein said semiconductor substrate has a (100) surface.

24. The method as claimed in claim 21, further including the step of providing an insulating film with an opening, said epitaxial silicon film being formed at least in said opening, wherein said insulating film is a thermal oxide film.

25. The method as claimed in claim 20, wherein said semiconductor substrate is heated at 700° C. or higher when said raw material gas is introduced.

26. The method as claimed in claim 25, wherein said hydrogen is supplied with a hydrogen gas having a flow rate corresponding to partial pressure of $9.6 \times 10^{-5}$ Torr or more.

27. The method as claimed in claim 26, wherein atomic hydrogen is produced from said hydrogen, said atomic hydrogen is adsorbed on the surface of said silicon substrate to reduce the surface free energy silicon of said silicon substrate.

* * * * *

UNITED STATES PATENT AND TRADEMARK OFFICE
CERTIFICATE OF CORRECTION

PATENT NO. : 5,861,059
DATED      : January 19, 1999
INVENTOR(S): Tatsuya Suzuki It is certified that error appears in the above-identified patent and that said Letters Patent is hereby corrected as shown below:

Column 3, line 38, delete "largely".

Column 5, line 24, delete 1.2 x 10-4" and insert --1.2 x $10^{-4}$--.

Signed and Sealed this

Twenty-fourth Day of August, 1999

Attest:

Q. TODD DICKINSON

Attesting Officer     Acting Commissioner of Patents and Trademarks